US007564132B2

(12) United States Patent
Ohto et al.

(10) Patent No.: US 7,564,132 B2
(45) Date of Patent: Jul. 21, 2009

(54) SEMICONDUCTOR CHIP

(75) Inventors: Koichi Ohto, Kanagawa (JP); Tatsuya Usami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 359 days.

(21) Appl. No.: 11/368,671

(22) Filed: Mar. 7, 2006

(65) Prior Publication Data

US 2006/0208361 A1 Sep. 21, 2006

(30) Foreign Application Priority Data

Mar. 18, 2005 (JP) ............................ 2005-079105

(51) Int. Cl.
*H01L 23/48* (2006.01)

(52) U.S. Cl. ....................... 257/750; 257/753; 257/760; 257/E51.038

(58) Field of Classification Search ................. 257/758, 257/759, 750, 774
See application file for complete search history.

(56) References Cited

U.S. PATENT DOCUMENTS

| | | | | |
|---|---|---|---|---|
| 5,293,073 | A * | 3/1994 | Ono | 257/740 |
| 6,429,518 | B1 * | 8/2002 | Endo | 257/753 |
| 6,537,904 | B1 * | 3/2003 | Ishizuka | 438/623 |
| 6,614,096 | B2 | 9/2003 | Kojima et al. | |
| 7,227,244 | B2 * | 6/2007 | Bjorkman et al. | 257/635 |
| 2004/0113238 | A1 * | 6/2004 | Hasunuma et al. | 257/636 |

FOREIGN PATENT DOCUMENTS

| | | |
|---|---|---|
| JP | 2002-203899 | 7/2002 |
| JP | 2004-179302 | 6/2004 |

* cited by examiner

*Primary Examiner*—Jasmine J Clark
(74) *Attorney, Agent, or Firm*—Young & Thompson

(57) ABSTRACT

A semiconductor chip 100 includes a semiconductor substrate (not shown), and a stacked film 150 formed over the semiconductor substrate, which includes carbon-containing insulating films such as a first interlayer insulating film 106, and carbon-free insulating films such as an underlying layer 102 and a top cover film 124. The end faces of the carbon-free insulating films herein are located on the outer side of the end faces of the carbon-containing insulating films. The carbon composition of the carbon-containing insulating films is lowered in the end portions thereof than in the inner portions. The film density of the carbon-containing insulating films is raised in the end portions thereof than in the inner portions.

19 Claims, 10 Drawing Sheets

124
122
120
134
118
116
114
132
112
110
108
130
106
104
102
150
100

134
124
122
120
118
116
114
112
132
110
108
106
104
130
102
150
101

134
124
122
120
118
116
114
112
132
110
108
106
104
130
102

OXIDATION
134
124
122
120
118
116
114
112
132
110
108
106
104
130
102

134
124
122
120
118
116
114
112
132
110
108
106
104
130
102
100

134
124
122
120
118
116
114
112
132
110
108
106
104
130
102
150
101

DICING, OXIDATION
134
124
122
120
118
116
114
112
132
110
108
106
104
130
102

134
124
122
120
118
116
114
112
132
110
108
106
104
130
102
100

200

100

SEMICONDUCTOR CHIP

This application is based on Japanese patent application No. 2005-079105 the content of which is incorporated hereinto by reference.

BACKGROUND

1. Technical Field

The present invention relates to a technique of improving adhesiveness of a carbon-containing insulating film with other insulating films.

2. Related Art

In keeping with recent demands on higher speed operations of semiconductor elements, extensive researches have been made on altering the interlayer insulating film in multi-level interconnect layers from conventional silicon oxide film (specific dielectric constant is approximately k=3.9) to a low-dielectric-constant material film, aiming at decreasing parasitic interconnect capacitance. The low-dielectric-constant material referred to herein means any insulating material having a specific dielectric constant of 3.3 or smaller. Carbon-containing silicon oxide material is one of such low-dielectric constant material, wherein recent investigations have also been made on development of a porous material having micro-pores introduced in the film thereof, for the purpose of further lowering the dielectric constant. Use of these low-dielectric-constant material makes it possible to reduce cross talk among interconnections, and to realize high speed operations of the elements.

A problem has, however, arisen in that the interlayer insulating film composed of such low-dielectric-constant material is poor in adhesiveness with an etching stopper film typically made of SiCN or with a protective insulating film typically made of $SiO_2$, which would result in peeling-off.

Japanese Laid-Open Patent Publication No. 2002-203899 discloses a technique of subjecting the insulating film to plasma treatment, to thereby improve the adhesiveness when copper was used as an interconnection material.

By the way, semiconductor devices are generally produced by cutting known as dicing using a cutting blade, so as to individualize the semiconductor chips. However, the individualization into the semiconductor chips by dicing has occasionally resulted in chipping of wafers. It has, therefore, been examined to carry out, as disclosed in Japanese Laid-Open Patent Publication No. 2004-179302, cutting and individualization typically by irradiating laser beam along the dicing line on a semiconductor wafer.

The conventional method described in Japanese Laid-Open Patent Publication No. 2002-203899, however, had to respectively subject copper and a barrier film in order to improve the adhesiveness, and consequently made the process more complicated.

SUMMARY OF THE INVENTION

According to the present invention, there is provided a semiconductor which includes:

a semiconductor substrate; and a stacked film, formed over the semiconductor substrate, including a carbon-containing insulating film and a carbon-free insulating film;

wherein the end face of the carbon-free insulating film is located on the outer side of the end face of the carbon-containing insulating film.

The present inventors found out that the semiconductor device having the carbon-containing insulating film composed of a low-dielectric-constant film, tends to cause separation between the low-dielectric-constant film and the etching stopper film at their end portions, after the semiconductor chips are individualized.

The carbon-containing insulating film is composed of a low-dielectric-constant material, and can be configured as an interconnection layer or a via layer having interconnections and vias formed therein. The carbon-containing insulating film can typically be composed of SiOC. According to the present invention, the end face of the carbon-containing insulating film is located on the inner side of the end face of the carbon-free insulating film. This makes it possible to prevent the end portion of the carbon-containing insulating film from being applied with impact by contact such as handling, after the semiconductor devices are individualized into semiconductor chips. It is also made possible to effectively reduce stress possibly applied to the end portion of the carbon-containing insulating film when, for example, the semiconductor chip is packaged using a molding resin.

It is to be noted herein that it is not always necessary that all end faces of the carbon-free insulating film are located on the outer side of the end faces of the carbon-containing insulating film, instead allowing that the end faces of the carbon-free insulating film are located, in an average sense, on the outer side of the end faces of the carbon-containing insulating film.

According to the present invention, there is also provided a semiconductor chip which includes:

a semiconductor substrate; and a stacked film, formed over the semiconductor substrate, including a carbon-containing insulating film;

wherein the carbon-containing insulating film has a carbon composition lowered in the end portion than in the inner portion.

The carbon composition referred to herein means ratio of carbon element to components included in the film, such as Si, O, C, N, H, and so forth.

When the insulating film contains carbon, the adhesiveness of the film with other insulating films degrades as the carbon composition in the film increases. To keep a desirable adhesiveness with other insulating film, it is preferable to lower the carbon composition in the insulating film. On the other hand, lowering of the carbon content in the insulating film undesirably raises the dielectric constant of the insulating film, and consequently result in an increased cross talk between interconnections. According to the present invention, the carbon-containing insulating film is configured as having the carbon composition lowered at the end portion than in the inner portion. This makes it possible to improve the adhesiveness of the carbon-containing insulating film at the end portion thereof. It is therefore made possible to suppress separation of the carbon-containing insulating film from the upper and lower layers at the end portion. It is also made possible to keep a low level of carbon content in the inner portion of the carbon-containing insulating film, and to consequently keep a low level of dielectric constant of the carbon-containing insulating film. This makes it possible to keep the dielectric constant low, and to suppress cross talk between interconnections.

According to the present invention, there is also provided a semiconductor chip which includes:

a semiconductor substrate; and a stacked film, formed over the semiconductor substrate, comprising a carbon-containing insulating film;

wherein the carbon-containing insulating film has a film density raised in the end portion than in the inner portion.

According to the present invention, the carbon-containing insulating film has the film density raised in the end portion than in the inner portion. This makes it possible to improve the adhesiveness of the carbon-containing insulating film at the end portion. It is therefore made possible to suppress separation of the carbon-containing insulating film from the upper and lower films at the end portion.

According to the present invention, there is also provided a method of fabricating a semiconductor chip which includes;

forming a stacked film, including a carbon-containing insulating film, on a semiconductor substrate;

dicing the semiconductor substrate from the surface side along the outer periphery of the chips to thereby allow the side faces of the carbon-containing insulating film to expose; and supplying an oxidative gas to the carbon-containing insulating film having the exposed side faces, to thereby oxidize the side faces of the carbon-containing insulating film.

According to the present invention, it is made possible to improve the adhesiveness between insulating materials of the semiconductor chip, by forming the stacked film on the semiconductor substrate and by supplying the oxidative gas during dicing. It is therefore no more necessary to carry out the plasma treatment every time the copper layer and the barrier layer are formed, and is then made possible to improve the adhesiveness between the insulating materials only by simple procedures.

According to the present invention, it is made possible to improve the adhesiveness of the interlayer insulating film with other insulating films, while keeping the dielectric constant of the interlayer insulating film low.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
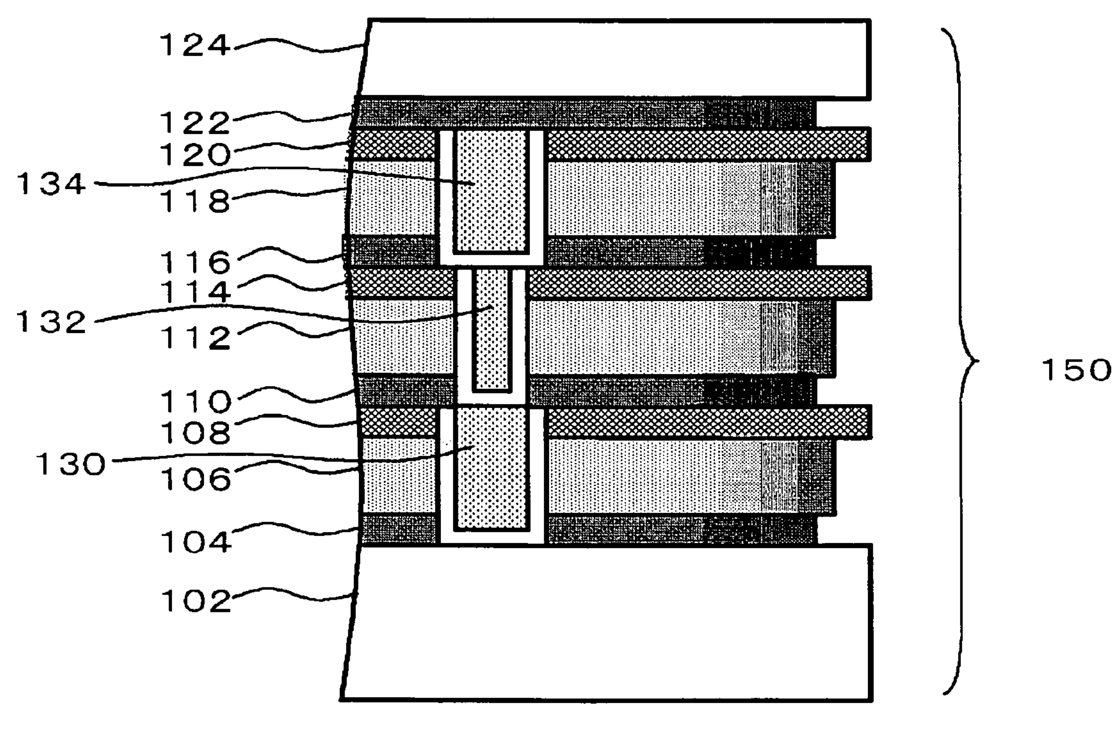
FIG. 1 is a sectional view showing a configuration of a semiconductor chip in one embodiment of the present invention.

FIG. 1 is a sectional view showing a part of a configuration of the semiconductor chip of this embodiment.

The semiconductor chip 100 includes a semiconductor substrate (not shown) and a stacked film formed over the semiconductor substrate, which includes carbon-containing insulating films (a first interlayer insulating film 106, a second interlayer insulating film 112, a third interlayer insulating film 118, a first etching stopper film 104, a second etching stopper film 110, a third etching stopper film 116, and a fourth etching stopper film 122) and carbon-free insulating films (an underlying layer 102 including transistors, a top cover film 124, a first protective insulating film 108, a second protective insulating film 114, and a third protective insulating film 120). The end faces of the carbon-free insulating films herein are located on the outer side of the end faces of the carbon-containing insulating films.

The carbon-containing insulating films are formed so as to have the carbon composition lowered in the end portions thereof than in the inner portions. The carbon-containing insulating films are formed so as to have the film density raised in the end portions thereof than in the inner portions.

Paragraphs below will detail a configuration of the semiconductor chip 100.

The semiconductor chip 100 includes the semiconductor substrate (not shown), and the stacked film 150 in which the underlying layer 102, the first etching stopper film 104, the first interlayer insulating film 106, the first protective insulating film 108, the second etching stopper film 110, the second interlayer insulating film 112, the second protective insulating film 114, the third etching stopper film 116, the third interlayer insulating film 118, the third protective insulating film 120, the fourth etching stopper film 122, and the top cover film 124 are stacked in this order. The semiconductor chip 100 includes also a first interconnection 130, a via plug 132, and a second interconnection 134.

The first interlayer insulating film 106, the second interlayer insulating film 112, and the third interlayer insulating film 118 are carbon-containing insulating films. Each of these films can typically be composed of a low-dielectric-constant film having a dielectric constant of 3.3 or smaller, and more preferably 2.9 or smaller. They can typically be configured using carbon-containing materials such as SiOC, methyl silsesquioxane (MSQ), hydrogenated methyl silsesquioxane (MHSQ), organic polysiloxane and films of these materials converted into porous ones. Use of these materials and lowering in the carbon composition of the film make it possible to improve the adhesiveness of these films with the etching stopper films composed of SiCN or the like. In this embodiment, each of the first interlayer insulating film 106, the second interlayer insulating film 112, and the third interlayer insulating film 118 can be composed of a SiOC film. SiOC herein may occasionally be expressed as SiOCH, and usually contains Si, O, C and H as constitutive elements.

In this embodiment, the first interlayer insulating film 106, the second interlayer insulating film 112, and the third interlayer insulating film 118 are formed so as to have the carbon compositions lowered in the end portions thereof than in the inner portions. Adoption of this configuration makes it possible to improve the adhesiveness of the first interlayer insulating film 106, the fourth interlayer insulating film 112, and the third interlayer insulating film 118 with the upper and lower layers, at the end portions thereof. These films are formed also so as to have the film density raised in the end portions than in the inner portions. Adoption of this configuration makes it possible to improve the adhesiveness of the first interlayer insulating film 106, the fourth interlayer insulating film 112, and the third interlayer insulating film 118 with the upper and lower layers, at the end portions thereof.

In this embodiment, the first etching stopper film 104, the second etching stopper film 110, the third etching stopper film 116, and the fourth etching stopper film 122 are carbon-containing insulating films. Each of the first etching stopper film 104, the second etching stopper film 110, the third etching stopper film 116, and the fourth etching stopper film 122 can typically be composed of a SiCN film or a SiC film. The first etching stopper film 104, the second etching stopper film 110, the third etching stopper film 116, and the fourth etching stopper film 122 may be composed of the same material, or may be composed of different materials. In this embodiment, each of the first etching stopper film 104, the second etching stopper film 110, the third etching stopper film 116, and the fourth etching stopper film 122 can be composed of a SiCN film.

In this embodiment, the first etching stopper film 104, the second etching stopper film 110, the third etching stopper film 116, and the fourth etching stopper film 122 are formed so as to have the carbon composition lowered in the end portions than in the inner portions. Adoption of this configuration makes it possible to improve the adhesiveness of the first etching stopper film 104, the second etching stopper film 110, the third etching stopper film 116, and the fourth etching stopper film 122 with the upper and lower layers, at the end portions thereof.

The first etching stopper film 104, the second etching stopper film 110, the third etching stopper film 116, and the fourth etching stopper film 122 are formed so as to have the film density raised in the end portions than in the inner portions. Adoption of this configuration makes it possible to improve the adhesiveness of these films with the upper and lower layers, at the end portions of these films.

The first protective insulating film 108, the second protective insulating film 114, and the third protective insulating film 120 are the carbon-free insulating films, and protect the first interlayer insulating film 106, the second interlayer insulating film 112, and the third interlayer insulating film 118, respectively. Each of the first protective insulating film 108, the second protective insulating film 114, and the third protective insulating film 120 can typically be composed of a $SiO_2$ film, a SiN film or the like. In this embodiment, each of the first protective insulating film 108, the second protective insulating film 114, and the third protective insulating film 120 can be composed of a $SiO_2$ film. Provision of such protective insulating films on the interlayer insulating films composed of a low-dielectric-constant material makes it possible to protect the interlayer insulating films when the first interconnection 130, via plug 132, and the second interconnection 134 are formed. More specifically, it is necessary in a process step of forming the first interconnection 130, the via plug 132, and the second interconnection 134 to remove a metal material exposed out over interconnection trenches and via holes by the chemical mechanical polishing (CMP) process, wherein it is made possible to protect the interlayer insulating films from being polished off.

The underlying layer 102 is formed over the semiconductor substrate such as a silicon substrate or the like. On the semiconductor substrate, transistors and the like are formed. Each of the underlying layer 102 and the top cover film 124 can typically be composed of a carbon-free insulating film such as a $SiO_2$ film, a SiN film, a SiON film or the like. In this embodiment, each of the underlying layer 102 and the top cover film 124 can be composed of a $SiO_2$ film.

In this embodiment, the end faces of the underlying layer 102, the first protective insulating film 108, the second protective insulating film 114, the third protective insulating film 120, and the top cover film 124, each of which being composed of a $SiO_2$ film as a carbon-free film, are located on the outer side of the end faces of the first etching stopper film 104, the second etching stopper film 110, the third etching stopper film 116, and the fourth etching stopper film 122, each of which being composed of a SiCN film as a carbon-containing film, and the end faces of the first interlayer insulating film 106, the second interlayer insulating film 112, and the third interlayer insulating film 118, each of which being composed of a SiOC film again as a carbon-containing film. By locating the end faces of the interlayer insulating films and the etching stopper film on the inner side of the end faces, for example, of the underlying layer 102 and the top cover film 124, it is made possible to reduce stress possibly exerted on the end portions of the interlayer insulating films and the etching stopper films, typically when the semiconductor chip 100 is packaged using a molding resin, and can prevent the peeling-off of the films at the end portions.

The end faces of the first interlayer insulating film 106, the second interlayer insulating film 112, and the third interlayer insulating film 118, each of which being composed of a SiOC film, are preferably configured as being inwardly recessed by 0.5 μm or more from the edges of the chip. This makes it possible to effectively lower the stress possibly applied to the end portions of the interlayer insulating films and the etching stopper films when the semiconductor chip 100 is packaged using a molding resin.

The end faces of the first etching stopper film 104, the second etching stopper film 110, the third etching stopper film 116, and the fourth etching stopper film 122, each of which being composed of a SiCN film, are located on the inner side of the end faces of the first interlayer insulating film 106, the second interlayer insulating film 112, and the third interlayer insulating film 118, each of which being composed of a SiOC film.

FIGS. 2A to 2D are sectional views showing process steps of fabricating the semiconductor chip 100 of this embodiment.

Figure 2A:
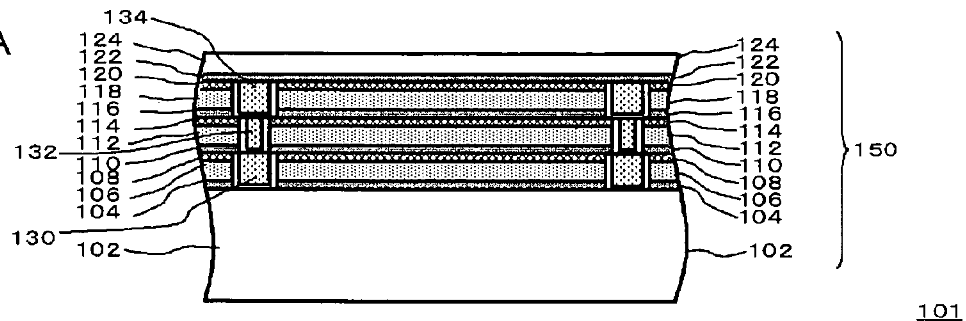
FIGS. 2A to 2D are sectional views showing process steps of fabricating the semiconductor chip shown in FIG. 1.
Figure 2B:
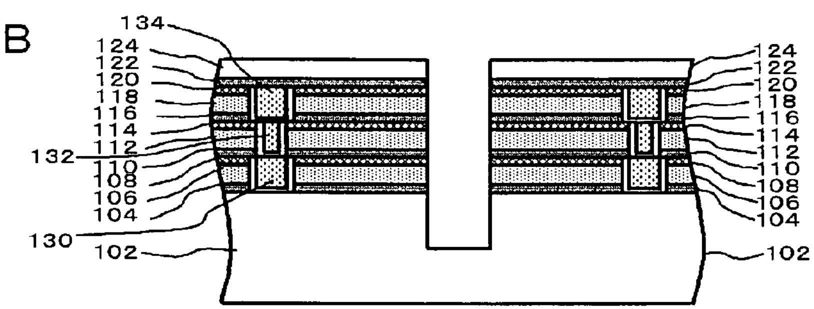
Figure 2C:
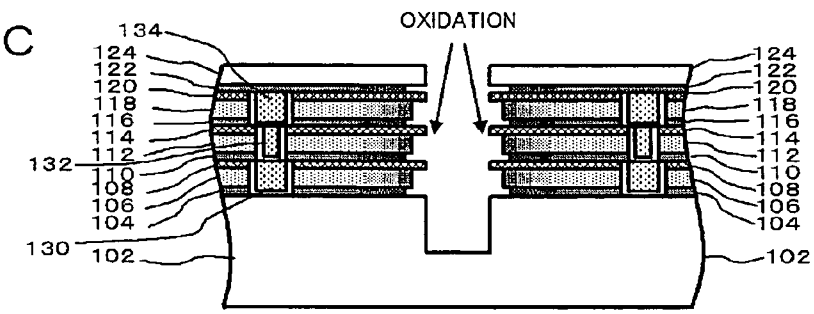

Procedures of fabricating the semiconductor chip 100 of this embodiment include a step of forming, on the semiconductor substrate (not shown), the stacked film 150 which includes the carbon-containing insulating films (the first interlayer insulating film 106, the second interlayer insulating film 112, the third interlayer insulating film 118, the first etching stopper film 104, the second etching stopper film 110, the third etching stopper film 116, and the fourth etching stopper film 122) (FIG. 2A), a step of dicing the semiconductor substrate from the surface thereof along the outer periphery of the chips to thereby allow the side faces of the carbon-containing insulating films to expose (FIG. 2B); and a step of supplying an oxidative gas to the carbon-containing insulating films having the exposed side faces, to thereby oxidize the side faces of the carbon-containing insulating films (FIG. 2C).

More specific explanation will be given below.

First, the stacked film 150 is formed over the semiconductor substrate (not shown) by ordinary methods (FIG. 2A). Exemplary procedures of fabricating a semiconductor device 101 shown in FIG. 2A will be described below. First, the underlying layer 102 is formed over the semiconductor substrate. The first etching stopper film 104 is then formed thereon by the plasma CVD process. Next, on the first etching stopper film 104, the first interlayer insulating film 106 is formed by the plasma CVD process under supply of trimethylsilane gas. The first protective insulating film 108 is then formed over the first interlayer insulating film 106 by the plasma CVD process. Next, according to publicly-known lithographic technique and etching technique, a resist film is formed with a predetermined pattern, and the first protective insulating film 108, the first interlayer insulating film 106, and the first etching stopper film 104 are etched through the resist film as a mask, to thereby form an interconnection trench.

The resist film used for forming the interconnection trench is then removed, and a barrier film is formed in the interconnection trench by the sputtering process. The barrier film can typically be composed of Ta/TaN, Ti, TiN, TiSiN, Ta, TaN, TaSiN and so forth. Next, on the barrier film, an interconnection metal film is formed so as to fill the interconnection trench, typically by the electroplating process. The interconnection metal film can typically be composed of Cu (copper), Ag (silver) or alloys of these metals. Exposed portions of the interconnection metal film and the barrier film, formed outside the interconnection trench, are then removed by CMP (chemical-mechanical polishing). The first interconnection 130 is thus formed.

Similarly to as described in the above, the second etching stopper film 110, the second interlayer insulating film 112, and the second protective insulating film 114 are formed over the first protective insulating film 108. The via hole is then formed according to a known lithographic technique and an etching technique, the inner portion of which is then filled with a barrier film and an interconnection metal film, and exposed portions of the interconnection metal film and the barrier film formed outside the via hole are removed. The via plug 132 is thus formed.

Again similarly to as described in the above, the third etching stopper film 116, the third interlayer insulating film 118, and the third protective insulating film 120 are formed over the second protective insulating film 114. The interconnection trench is then formed according to known lithographic technique and an etching technique, the inner portion of which is then filled with the barrier film and the interconnection metal film, and unnecessary portions of the interconnection metal film and the barrier film formed outside the via hole are removed by CMP. The second interconnection 134 is thus formed.

Although FIG. 2A shows only the first interconnection 130, the via plug 132 and the second interconnection 134, repetition of procedures similar to those described in the above makes it possible to form the semiconductor device having a multi-layered interconnection structure. On the multi-layered interconnection structure, the fourth etching stopper film 122 is then formed, and further thereon the top cover film 124 is formed.

Next, the semiconductor substrate of thus-fabricated semiconductor device 101 is diced from the surface thereof along the outer periphery of the chips, to thereby individualize it into a plurality of semiconductor chips 100. The procedures will be described below.

First, the semiconductor device 101 is cut from the upper surface of the semiconductor substrate by blade dicing, laser dicing, or a combination of lithographic and etching techniques, along the outer periphery of the chips, to thereby allow the side faces of at least the carbon-containing insulating films of the stacked film 150 to expose (FIG. 2B). In this embodiment, each semiconductor chip 100 has not been individualized yet up to this process step, and the cutting is only made halfway. FIG. 2B shows a state having the under lying layer 102 cut halfway, whereas it is also allowable to cut the whole thickness of the underlying layer 102 and to cut the semiconductor substrate (not shown) halfway.

In this state, an oxidative gas is then supplied to the stacked film 150 having the exposed side faces, to thereby oxidize the side faces of the carbon-containing insulating films in the stacked film 150 (FIG. 2C). The oxidative gas may be an oxygen-containing gas, and more specifically, a gas containing any one of $O_2$, $O_3$, $N_2O$, CO, and $CO_2$. The oxidation herein can adopt the methods below. Conditions optimized for each of the methods will be adopted.

(1) Thermal Oxidation

Oxidative gas: a gas containing any one of $O_2$, $N_2O$, CO and $CO_2$;

Process temperature: room temperature (RT) to 400° C.; and

Process time: 30 minutes.

By optimizing the above-descried conditions, the end portions of the carbon-containing insulating films can be shrunk, and can consequently be configured as being inwardly recessed from the edges of the chip. For example, adjustment of the temperature of the semiconductor substrate to 200° C., and heating in the air atmosphere for approximately 30 minutes make it possible to locate the end faces of the first interlayer insulating film 106, the second interlayer insulating film 112, and the third interlayer insulating film 118, each of which composed of a SiOC film, as being inwardly recessed by 0.5 μm from the edges of the chip. Such conditions also allows oxidation of the end portions of these films, and the end portions of the films lower the carbon composition thereof as the oxygen composition raises. The end potions of these films also increase the film density thereof as the carbon composition decreases. This makes it possible to improve the adhesiveness of the end portions of the films with the upper and lower layers. It is therefore made possible to suppress separation of the end portions of the films from the respective upper and lower layers.

(2) UV Treatment

Oxidative gas: a gas containing any one of $O_3$, $O_2$, $N_2O$, CO and $CO_2$;

Process temperature: room temperature (RT) to 400° C.; and

Process time: 5 minutes.

In this case, for example by adjusting the temperature of the semiconductor substrate to 200° C. and irradiating UV in the air atmosphere with a lamp power of 1000 W for 5 minutes, it is made possible to configure the first interlayer insulating film 106, the second interlayer insulating film 112, and the third interlayer insulating film 118, each of which composed of a SiOC film, as being inwardly recessed by 0.5 μm from the edges of the chip.

(3) Plasma Treatment

Oxidative gas: a gas containing any one of $O_2$, $N_2O$, CO and $CO_2$;

Process temperature: room temperature (RT) to 400° C.; and

Process time: 5 minutes.

In this case, for example by using a parallel-plate-type plasma treatment apparatus, adjusting the temperature of the semiconductor substrate to 200° C., and irradiating plasma in an $O_2$ atmosphere under a process pressure of 5 Torr and an RF power of 500 W for 5 minutes, it is made possible to configure the first interlayer insulating film 106, the second interlayer insulating film 112, and the third interlayer insulating film 118, each of which being composed of a SiOC film, as being inwardly recessed by 0.5 μm from the edges of the chip.

As described in the above, by oxidizing the side faces of the carbon-containing insulating films using an oxidative gas while allowing the side faces of the carbon-containing insulating film to expose, the end portions of the carbon-containing insulating films are oxidized at the end portions thereof, and at the same time lowered in the carbon composition due to elimination of carbon. By this process, the carbon-containing insulating film is configured as having, in the vicinity of the end portion thereof, a region in which the carbon composition increases towards the inner portion. The carbon-containing insulating film increases the film density as the carbon content thereof decreases. The carbon-containing insulating film is therefore configured as having, in the vicinity of the end portion thereof, a region in which the film density decreases towards the inner portion.

In this embodiment, the etching stopper films including the first etching stopper film 104 composed of a SiCN film shrinks to an extent larger than that of the interlayer insulating films including the first interlayer insulating film 106 composed of a SiOC film. In this embodiment, the end faces of the etching stopper films including the first etching stopper film 104 are therefore located as being inwardly recessed from the end faces of the interlayer insulating films such as the first interlayer insulating film 106.

In this case, during the oxidization, the first interlayer insulating film 106 for example is oxidized not only on the side faces thereof, but also on a part of the surface in contact with the first etching stopper film 104 as the part of the surface is exposed. As a consequence, the first interlayer insulating film 106 has the carbon composition lowered in the region in contact with the first etching stopper film 104 than in the inner portion. Similarly, the first interlayer insulating film 106 has the film density raised in the end portion of the region in contact with the first etching stopper film 104 than in the inner portion. The same will apply also to the other interlayer insulating films.

Figure 2D:
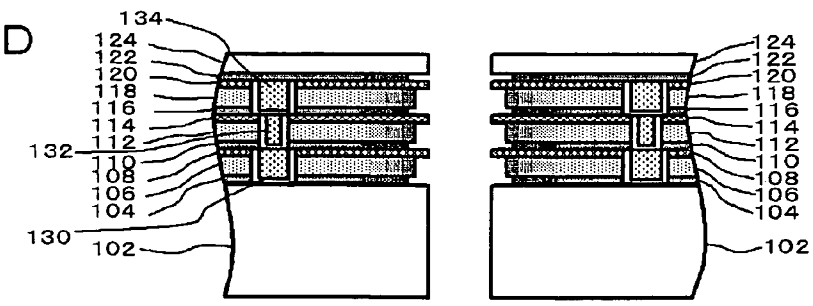

Next, the uncut semiconductor substrate is cut by blade dicing, to thereby individualize a plurality of semiconductor chips (FIG. 2D).

As described in the above, according to the semiconductor chip 100 of this embodiment, the end faces of the carbon-containing insulating films are configured as being located on the inner side of the end faces of the carbon-free insulating films. It is therefore made possible to prevent the end portions of the carbon-containing insulating films from being applied with impact due to contact during handling, after the semiconductor device was individualized into the semiconductor chips. It is also made possible to effectively suppress the stress possibly applied to the end portions of the carbon-containing insulating films, typically when the semiconductor chip is packaged using a molding resin.

The semiconductor chip 100 of this embodiment is configured as having the carbon-containing insulating films having the carbon composition lowered in the end portions thereof than in the inner portions. This makes it possible to improve the adhesiveness of the carbon-containing insulating films at the end portions thereof. It is therefore made possible to suppress separation of the carbon-containing insulating film from the upper and lower layers at the end portions.

The semiconductor chip 100 of this embodiment is configured as having the carbon-containing insulating films having the film density raised at the end portions thereof than in the inner portions. This makes it possible to improve the adhesiveness of the carbon-containing insulating films at the end portions thereof. It is therefore made possible to suppress separation of the carbon-containing insulating films from the upper and lower layers at the end portions.

For an additional case where the interlayer insulating film and the etching stopper film are composed of the carbon-containing insulating films, it is made possible to configure both of these films as described in the above, to effectively improve the adhesiveness between these films, and to suppress the separation.

Second Embodiment

Also in this embodiment, the semiconductor chip has a configuration same as that of the semiconductor chip 100 of the first embodiment. This embodiment differs from the first embodiment in procedures of individualizing the semiconductor chips.

Figure 3A:
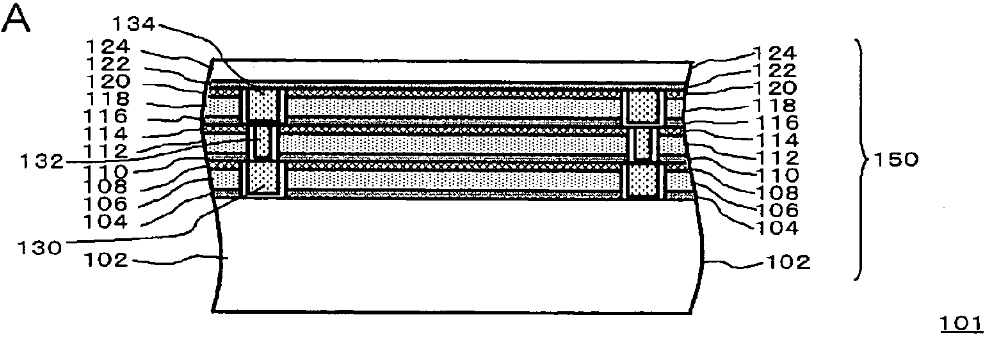
FIGS. 3A to 3C are sectional views showing process steps of fabricating the semiconductor chip of one embodiment of the present invention.
Figure 3B:
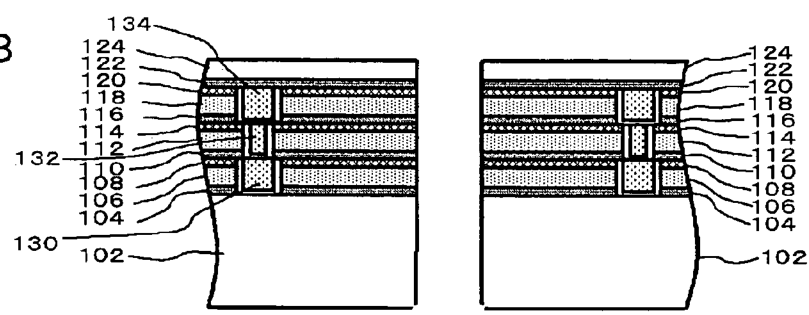
Figure 3C:
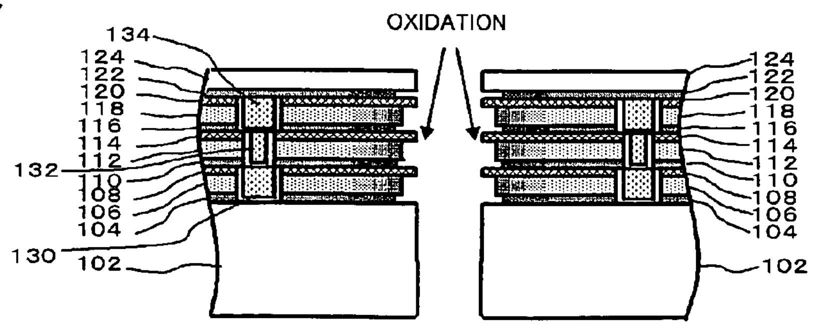

FIGS. 3A to 3C are sectional views showing process steps of fabricating the semiconductor chip 100 of this embodiment.

Also in this embodiment, the semiconductor device 101 is formed according to procedures similar to those in the first embodiment explained referring to FIG. 2A (FIG. 3A).

Then, firstly, the semiconductor device 101 is cut from the upper surface of the semiconductor substrate by blade dicing, laser dicing, or a combination of lithographic and etching techniques, along the outer periphery of the chips, to thereby individualize the semiconductor chips 100 (FIG. 3B). The side faces of the stacked film 150 are thus exposed. An oxidative gas is then supplied to the stacked film 150 having the exposed side faces, to thereby oxidize the side faces of the carbon-containing insulating films in the stacked film 150 (FIG. 3C). Conditions for the oxidation may be same as those in the first embodiment.

Also this embodiment is successful in obtaining the effects same as those of the semiconductor chip 100 in the first embodiment.

Third Embodiment

Also in this embodiment, the semiconductor chip has a configuration same as that of the semiconductor chip 100 of the first embodiment. This embodiment differs from the first embodiment in procedures of individualizing and oxidizing the semiconductor chips.

Figure 4A:
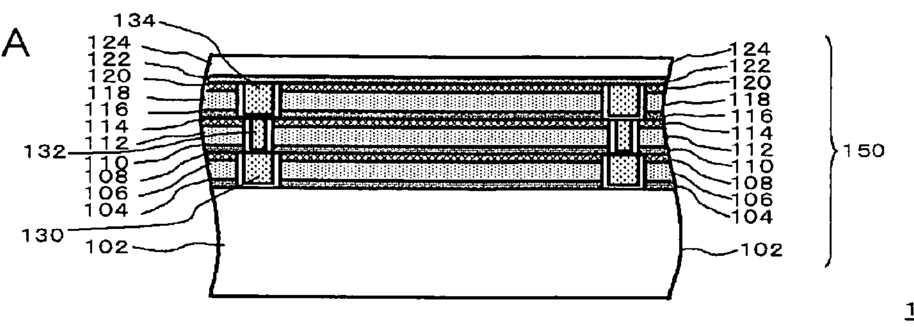
FIGS. 4A to 4C are sectional views showing process steps of fabricating the semiconductor chip of one embodiment of the present invention.
Figure 4B:
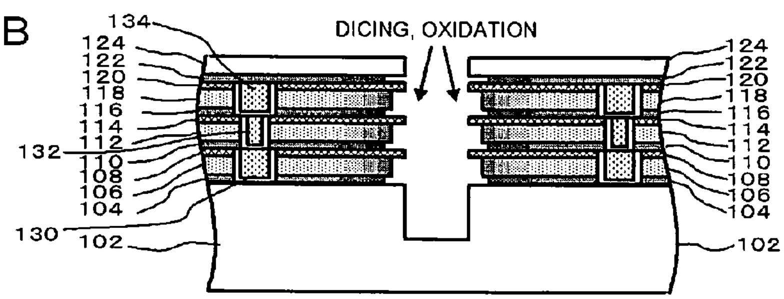
Figure 4C:
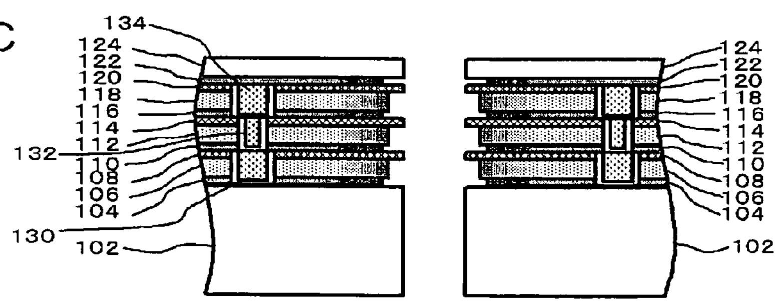

FIGS. 4A to 4C are sectional views showing process steps of fabricating the semiconductor chip 100 of this embodiment.

Also in this embodiment, the semiconductor device 101 is formed according to procedures similar to those in the first embodiment explained referring to FIG. 2A (FIG. 4A). The semiconductor device 101 is then diced from the upper surface of the semiconductor substrate by blade dicing, laser dicing, or a combination of lithographic and etching techniques, along the outer periphery of the chips, and at the same time an oxidative gas is supplied so as to proceed oxidation (FIG. 4B). The side faces of the stacked film 150 of the semiconductor device 101 are thus oxidized. Conditions for the oxidation may be same as those in the first embodiment.

By the processes described in the above, the end portions of the carbon-containing insulating films can be shrunk, and the end faces of the carbon-containing insulating films can be located on the inner side of the edges of the chip. Such conditions also make it possible to oxidize the end portions of these films, and result in increase in the oxygen composition and decrease in the carbon composition in the end portions of the films. The end portions of these films are increased in the film density, as well as being decreased in the carbon composition. These processes are successful in improving the adhesiveness of the end portions of the films with the upper and lower layers, and thereby in suppressing separation of the end portions of the films from the upper and lower layers (FIG. 4C).

Also this embodiment is successful in obtaining the effects same as those of the semiconductor chip 100 in the first and second embodiments.

EXAMPLES

Example 1

The semiconductor chip was fabricated according a part of the procedures similarly to that explained in the first embodiment explained referring to FIG. 2A. First, an underlying insulating film was provided on the semiconductor substrate, and the SiCN film (50 nm thick) was formed thereon by the plasma CVD process. On the SiCN film, a SiOC film (300 nm thick) was then formed by the plasma CVD process. On the SiOC film, a $SiO_2$ film (100 nm thick) was then formed by the plasma CVD process. A resist film was then formed over the $SiO_2$ film, and an interconnection trench was formed by a lithographic technique and an etching technique. The resist film was then removed. A Ta/TaN film was then formed in the interconnection trench by the sputtering process. On this barrier film, an interconnection metal film was formed by the electroplating process so as to fill the interconnection trench. Exposed portions of the interconnection metal film and the barrier film formed outside the interconnection trench were then removed by CMP, a $SiO_2$ film was formed further thereon, to thereby fabricate the semiconductor device.

Thus-fabricated semiconductor device was then diced halfway, according to the procedures explained in the first embodiment referring to FIGS. 2B to 2D. Next, the semiconductor substrate was elevated in the temperature up to 200° C., and heated in the air atmosphere for approximately 30 minutes so as to proceed oxidation (thermal oxidation). The semiconductor substrate was then diced to thereby individualize the semiconductor chips 100.

Example 2

The semiconductor device was fabricated according to the procedures similar to those in example 1, and was then diced in the air atmosphere at normal temperature, to thereby individualize the semiconductor chips.

Figure 5A:
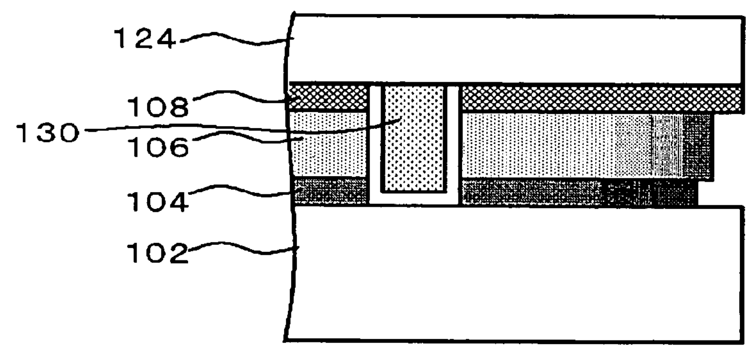
FIGS. 5A and 5B are sectional views showing configurations of the semiconductor chips fabricated in example 1 and example 2.

FIG. 5A is a sectional view showing a result of photographic observation of the semiconductor chip fabricated in example 1, taken under a TEM (transmission electron microscope). The end face of the SiOC film (106) was found to be inwardly recessed by 0.5 μm from the end face of the $SiO_2$ film (108).

Figure 5B:
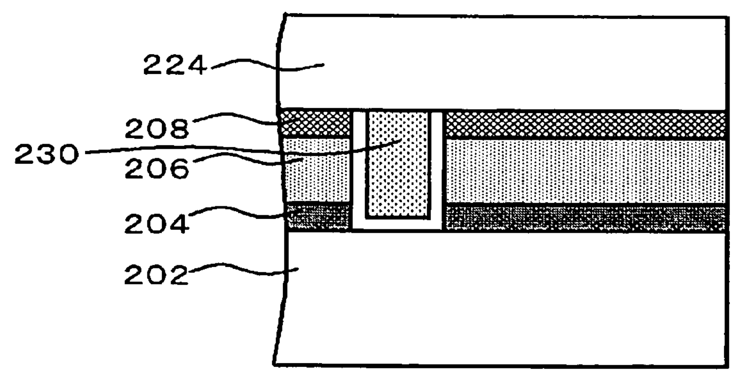

FIG. 5B is a sectional view showing a result of TEM photographic observation of the semiconductor chip fabricated in example 2. The semiconductor chip 200 includes an underlying layer 202, an etching stopper film 204, an interlayer insulating film 206, a protective insulating film 208, and a top cover film 224 ($SiO_2$ film) In this example, shrinkage was observed neither in the etching stopper film 204 composed of a SiCN film, nor in the interlayer insulating film 206 composed of a SiOC film.

Figure 6:
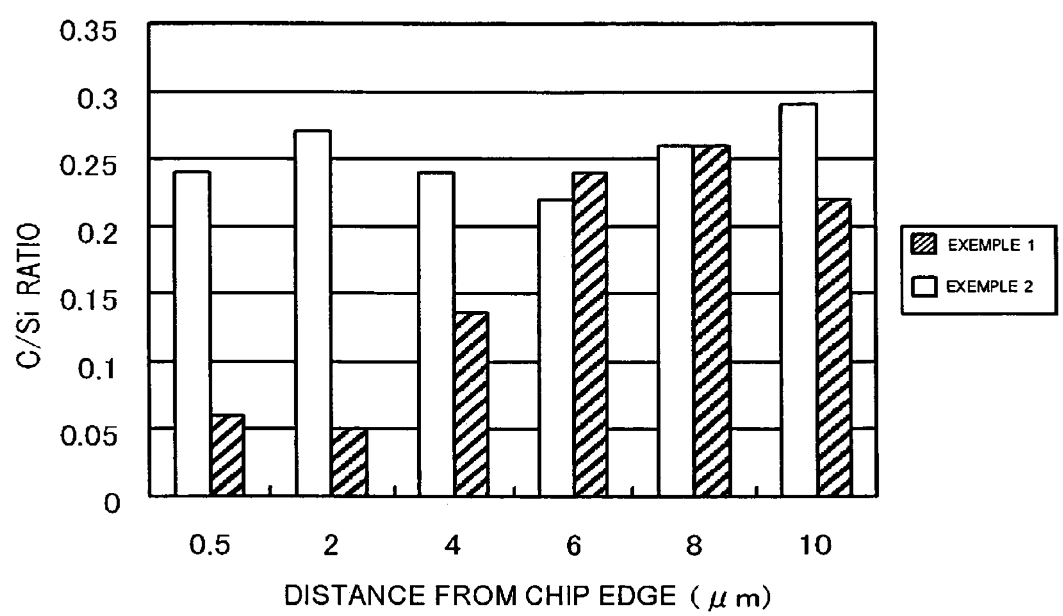
FIG. 6 is a drawing showing relations between the distance of a SiOC film from the edges of the semiconductor chips, fabricated according to the procedures descried in example 1 and example 2, and the carbon composition.

FIG. 6 is a drawing showing relations between the distance of the SiOC film from the edges of the semiconductor chips, fabricated according to the procedures descried in example 1 and example 2, and the carbon composition.

The carbon composition was calculated by measuring ratio of intensities of carbon (C) and silicon (Si) in analysis of sectional TEM image using an EDX (energy dispersive X-ray) fluorescence spectrometer.

As shown in the drawing, the SiOC film of the semiconductor chip fabricated in example 1 showed a C/Si ratio of approximately 0.05 both at a 0.5-μm position (end face) and a 2-μm position recessed from the edges of the chip, proving lowering in the carbon composition as compared with that in the inner portion. The SiOC film in example 1 was confirmed to have a region in the vicinity of the end portion thereof, in which the carbon composition increases towards the inner portion. The SiOC film of the semiconductor chip fabricated in example 2 was found to have the carbon concentration kept at an almost constant level over the range from the end portion to the inner portion.

Figure 7:
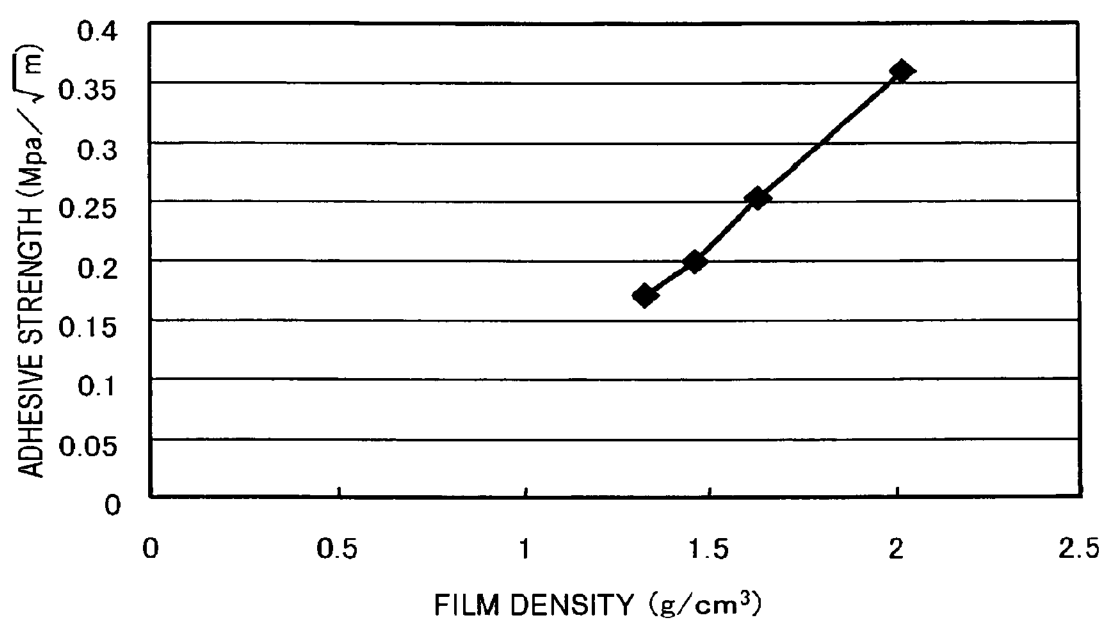
FIG. 7 is a drawing showing the film density ($g/cm^3$) of the SiOC film in relation to the adhesive strength ($MPa \cdot m^{1/2}$) of the SiOC film to a SiCN film.

FIG. 7 is a drawing showing the film density (g/cm$^3$) of the SiOC film in relation to the adhesive strength (MPa·m$^{1/2}$) between the SiOC film and the SiCN film. The adhesive strength was evaluated according to the m-ELT (modified edge liftoff test) method. As can be seen in the drawing, it was demonstrated that a higher film density resulted in a larger adhesive strength.

Figure 8:
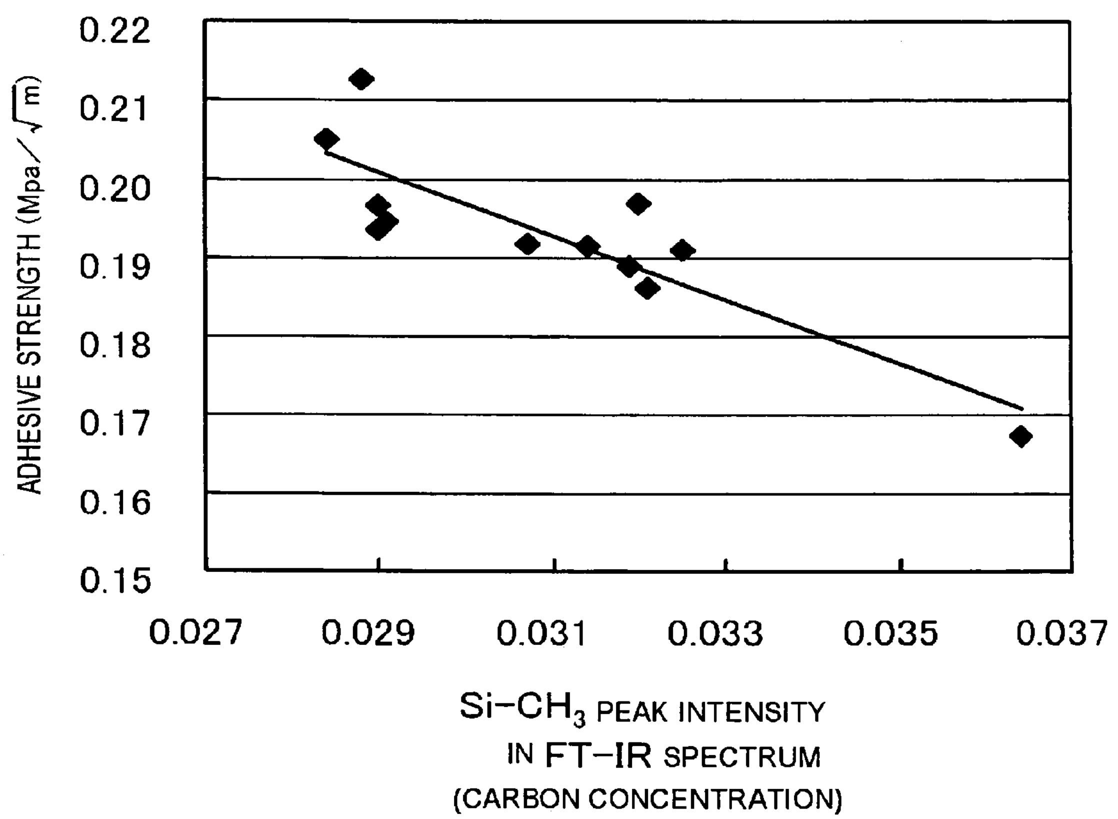
FIG. 8 is a drawing showing the carbon concentration of the SiOC film in relation to the adhesive strength ($MPa \cdot m^{1/2}$) of the SiOC film to a SiCN film.

FIG. 8 is a drawing showing the carbon concentration (Si—$CH_3$ peak intensity in FT-IR spectrum) of the SiOC film in relation to the adhesive strength (MPa·m$^{1/2}$) between the SiOC film and the SiCN film. As can be seen in the drawing, it was demonstrated that a lower carbon composition in the film resulted in a larger adhesive strength.

Figure 9:
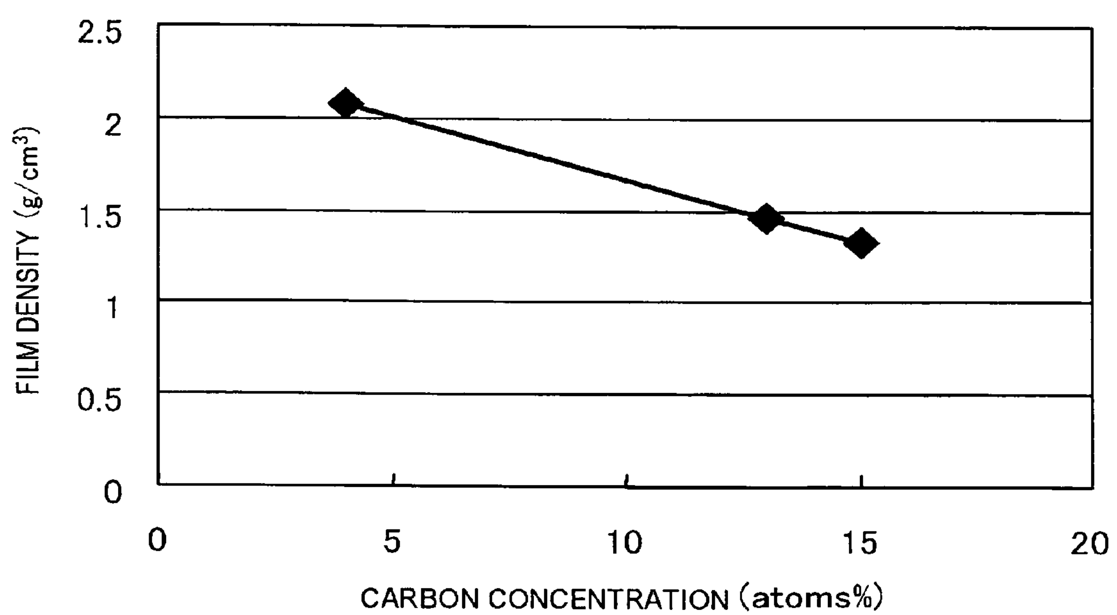
FIG. 9 is a drawing showing relations between the carbon concentration and the film density.

FIG. 9 is a drawing showing relations between the carbon concentration and the film density. As can be seen in the drawing, the lower the carbon concentration became, the larger the film density grew.

Paragraphs in the above have explained the present invention referring to the embodiments and examples. These embodiments and examples are merely for exemplary purposes, so that it will readily be understood by those skilled in the art that there are many possible modifications, and that such modifications are also within the scope of the present invention.

The embodiments shown in the above dealt with the configurations in which the semiconductor chip 100 included a stacked film formed by the single damascene process, whereas the stacked film of the semiconductor chip 100 may be formed by the dual damascene process.

The embodiments explained in the above dealt with the case in which the etching stopper films were composed of the carbon-containing insulating films, whereas the etching stopper films may be composed of a carbon-free material such as in a form of SiN film, $SiO_2$ film and so forth. The embodiments explained in the above dealt with the case in which the protective insulating films were composed of the carbon-free insulating film, whereas the protective insulating films may be composed of a carbon-containing material such as in a form of SiCN film, SiC film and so forth.

Figure 10:
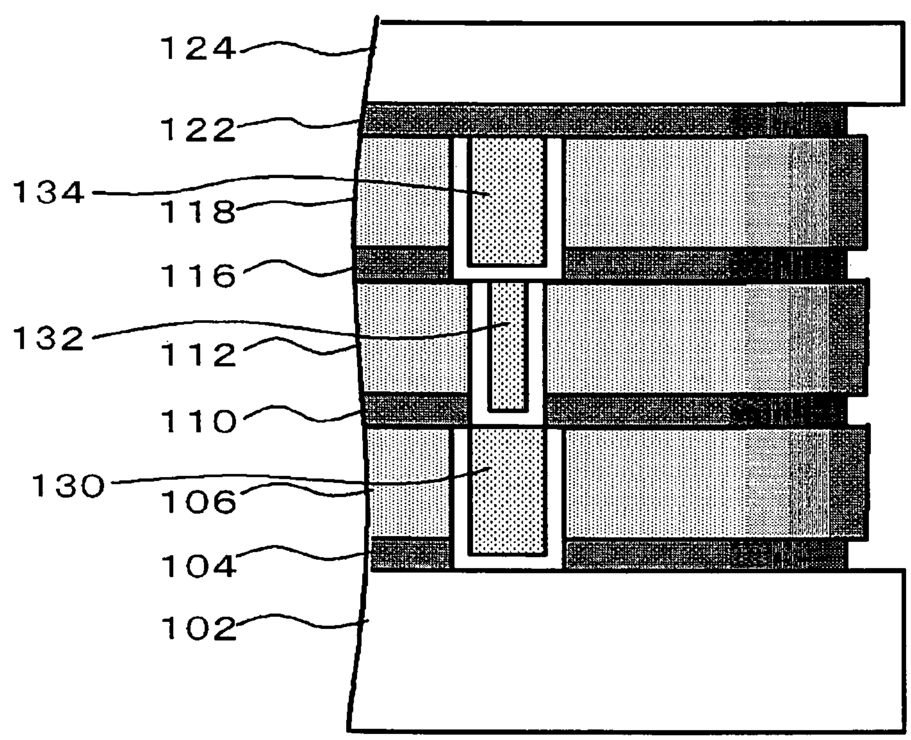
FIG. 10 is a sectional view showing another exemplary configuration of the semiconductor chip.

It is still also allowable, as shown in FIG. 10, to configure the stacked film of the semiconductor chip 100 as having no protective insulating film. Also in this case, the end faces of the underlying layer 102 and the top cover film 124 of the semiconductor chip 100 are located on the outer side of the end faces of the first interlayer insulating film 106, the second interlayer insulating film 112, the third interlayer insulating film 118 and so forth, so that it is made possible to prevent the end portions of the carbon-containing insulating films from being applied with impact by contact such as handling, after the semiconductor devices are individualized into semiconductor chips. This also makes it possible to effectively reduce stress possibly applied to the end portions of the carbon-containing insulating films when, for example, the semiconductor chip is packaged using a molding resin. The adhesiveness is also improved.

The embodiments shown in the above dealt with the examples in which the carbon concentration was lowered or the film density was raised in the end portions of the carbon-containing insulating films of the semiconductor chip 100 by the oxidation using an oxidative gas, whereas it is also allowable to use any other method to thereby lower the carbon concentration or to thereby raise the film density in the end portions of the carbon-containing insulating films of the semiconductor chip 100. It is allowable, for example, to carry out UV treatment in a vacuum atmosphere so as to eliminate carbon from the end portions of the carbon-containing films of the semiconductor chip 100, to thereby lower the carbon composition and to raise the film density in these portions.

It is apparent that the present invention is not limited to the above embodiments, and may be modified and changed without departing from the scope and spirit of the invention.

What is claimed is:

1. A semiconductor chip comprising:

a semiconductor substrate; and a stacked film having a side edge, formed over said semiconductor substrate, comprising a carbon-containing insulating film and a carbon-free insulating film, and end face at said side edge of said carbon-free insulating film extending beyond an end face at said side edge of said carbon-containing insulating film, wherein said carbon-containing insulating film has a lower carbon content in an end portion of said carbon-containing insulating film than in an inner portion thereof.

2. The semiconductor chip as claimed in claim 1, wherein said carbon-containing insulating film includes, in the vicinity of an end portion thereof, a region in which the carbon content increases towards an inner portion thereof.

3. The semiconductor chip as claimed in claim 1, wherein said carbon-containing insulating film has a higher film density in an end portion thereof than in an inner portion thereof.

4. The semiconductor chip as claimed in claim 1, wherein said carbon-containing insulating film includes, in the vicinity of the end portion thereof, a region in which the film density decreases towards the inner portion thereof.

5. The semiconductor chip as claimed in claim 1, further comprising another insulating film provided in contact with said carbon-containing insulating film, wherein said carbon-containing insulating film has a lower carbon content in an end portion thereof that is in contact with said another insulating film than in an inner portion thereof in contact with said another insulating film.

6. The semiconductor chip as claimed in claim 1, further comprising another insulating film provided in contact with said carbon containing insulating film, wherein said carbon-containing insulating film has a higher film density in an end portion thereof that is in contact with said another insulating film than in an inner portion thereof in contact with said another insulating film.

7. The semiconductor chip as claimed in claim 5, wherein said another insulating film is composed of SiCN or SiC.

8. The semiconductor chip as claimed in claim 6, wherein said another insulating film is composed of SiCN or SiC.

9. The semiconductor chip as claimed in claim 1, wherein said carbon-containing insulating film is composed of SiOC, SiCN or SiC.

10. A semiconductor chip comprising:

a semiconductor substrate; and a stacked film, formed over said semiconductor substrate, comprising a carbon containing insulating film, said carbon-containing insulating film having a lower carbon content in an end portion thereof than in an inner portion thereof.

11. The semiconductor chip as claimed in claim 10, wherein said carbon containing insulating film includes a region in which the carbon content increases from an end portion of the carbon containing insulating film towards an inner portion thereof.

12. The semiconductor chip as claimed in claim 10, wherein said carbon containing insulating film is composed of SiOC, SiCN or SiC.

13. The semiconductor chip as claimed in claim 10, further comprising another insulating film provided in contact with said carbon-containing insulating film, wherein said carbon-containing insulating film has a lower carbon content in an end portion thereof that is in contact with said another insulating film than in an inner portion thereof that is in contact with said another insulating film.

14. The semiconductor chip as claimed in claim 13, wherein said another insulating film is composed of SiCN or SiC.

15. A semiconductor chip comprising:

a semiconductor substrate; and a stacked film, formed over said semiconductor substrate, comprising a carbon-containing insulating film, said carbon-containing insulating film having a higher film density in an end portion thereof than in an inner portion thereof.

16. The semiconductor chip as claimed in claim 15, wherein said carbon-containing insulating film includes a region in which the film density decreases from an end portion thereof towards the inner portion thereof.

17. The semiconductor chip as claimed in claim 15, wherein said carbon-containing insulating film is composed of SiOC, SiCN or SiC.

18. The semiconductor chip as claimed in claim 15, further comprising another insulating film provided in contact with said carbon-containing insulating film, wherein said carbon-containing insulating film has an increased film density in an end portion thereof that is in contact with said another insulating film than in an inner portion thereof that is in contact with said another insulating film.

19. The semiconductor chip as claimed in claim 18, wherein said another insulating film is composed of SiCN or SiC.

* * * * *